United States Patent [19]

Freyman

[11] Patent Number: 5,081,377
[45] Date of Patent: Jan. 14, 1992

[54] LATCH CIRCUIT WITH REDUCED METASTABILITY

[75] Inventor: Ronald L. Freyman, Bethlehem, Pa.

[73] Assignee: AT&T Bell Laboratories, Murray Hill, N.J.

[21] Appl. No.: 586,127

[22] Filed: Sep. 21, 1990

[51] Int. Cl.⁵ .................. H03K 19/00; H03K 17/16
[52] U.S. Cl. .................................... 307/480; 307/443
[58] Field of Search ............ 307/480, 443, 279, 272.1, 307/272.2, 442; 326/490 SE

[56] References Cited

U.S. PATENT DOCUMENTS

| | | | |
|---|---|---|---|
| 4,398,105 | 8/1983 | Keller | 307/518 |
| 4,498,176 | 2/1985 | Wagner | 307/480 |
| 4,591,737 | 5/1986 | Campbell | 307/272 A |
| 4,719,366 | 1/1988 | Tan | 307/272.2 |
| 4,777,388 | 10/1988 | Widener | 307/272.2 |
| 4,786,829 | 11/1988 | Letcher | 307/480 |
| 4,808,840 | 2/1989 | Chung et al. | 307/290 |
| 4,920,282 | 4/1990 | Muraoka | 307/279 |
| 4,963,772 | 10/1990 | Duke | 307/480 |

Primary Examiner—Edward P. Westin
Assistant Examiner—Andrew Sanders
Attorney, Agent, or Firm—James H. Fox

[57] ABSTRACT

A latch circuit employs a feedback arrangement comprising a transmisson gate circuit that conducts only when the output node is in a mid-voltage state. At the onset of a metastable state, the feedback arrangement forces a receiving node into its previous stable state, thereby forcing the output node into a stable state. This eliminates or reduces the possibility that the latch could remain hung for an indefinite period in a metastable state.

15 Claims, 3 Drawing Sheets

LATCH CIRCUIT WITH REDUCED METASTABILITY

BACKGROUND OF THE INVENTION

1. Field of the Invention

The present invention relates to integrated circuits having latch circuitry that operates with asynchronous signals.

2. Description of the Prior Art

Latch circuits are widely used to capture and temporarily store logic signals in integrated circuits. For example referring to FIG. 6, a microprocessor (60) may receive inputs ($I_1$, $I_2$, $I_3$) from a variety of external sources that are asynchronous from the microprocessor (60) clock (clock). A latch (65) at a given input (line 61) allows the external signal to be received at any time, and clocked out into the microprocessor circuitry at a time determined by the microprocessor clock. The design of a typical "DQ" latch is illustrated in FIG. 3. The clock signals SCK, MCKL and SCKL may be generated from the master clock signal MCK by the action of inverters 416, 417, 418, and 419 as shown in FIG. 4, with other clock schemes being possible.

The operation of the DQ circuit is as follows: A signal at the D input is passed through the transmission gates 300, 301 to node 302 when the "master" clock MCK is high (and SCK low). The inverters 303 and 304 supply the signal to node 305. The feedback transmission gates 306 and 307 provide positive feedback that holds the voltage at node 302 at its previous state (i.e., latches node 302) when signal SCKL is high (and MCKL low). The signal on node 305 is passed through transmission gates 308 and 309 when the "slave" clock signal SCK is high (and MCK low). The inverters 311 and 312 provide the output signal Q at node 313. The transmission gates 314 and 315 provide for latching node 313 when MCKL is high (and SCKL low) by conducting positive feedback to the input of inverter 311. The net result is that either a low or high logic level (e.g., $V_{SS}$ or $V_{DD}$) at the D input is latched at the Q output when the clock MCK goes low. Thereafter, the Q output can not change state until the next high to low transition of the MCK clock.

One problem with latch circuitry occurs when the voltage at the D input changes at the same time that the clock signal MCK makes its high-to-low transition. For example, if the D input is making a low-to-high transition at that moment, then it is indeterminate whether a low or high voltage will appear at the Q output. In fact, the Q output may remain at an intermediate state midway between the logic levels (e.g., about $V_{DD}/2$, which is 2.5 volts in the case of a 5 volt power supply) for an indefinite period of time. In that case, the output is said to be metastable, which is also referred to as being "hung". The time necessary to resolve the output, that is, to go to either a high or low stable state, is a measure of the effectiveness of the overall design of the latch circuitry.

To reduce the probability of a metastable output, circuit designers typically choose the gain of the inverters (303, 304, 311, and 312) to be relatively high. This provides a large positive feedback signal through the feedback transmission gates (306–307 and 314–315), in order to promote achieving a stable state in a short time period after the high-to-low transition of clock MCK. In addition, the clock signals to the feedback transmission gates (MCKL, SCKL) are typically delayed with respect to the clock signals MCK and SCK. This delay may be accomplished by inverters 417, 418, and 419 as shown in FIG. 4. The delayed clock signals MCKL and SCKL then help assure that the feedback signal applied to the input of inverter 303 arrives at the same time as the clock MCK is making a high-to-low transition (and SCK a low-to-high transition). In this manner, the possibility of contention between the D signal and the feedback signal is minimized. Such contention could otherwise pull node 302 in opposite directions, which would increase the probability that the output would hang. A similar situation obtains for the delayed clock signals applied to the feedback transmission gates 314 and 315.

Although these steps reduce the probability of a metastable output, it is still possible for a transition of the D input to occur so close in time to a transition of the MCK clock that a metastable output can occur. It can be seen that a metastable output can cause erroneous signals to be supplied to a microprocessor or other circuitry connected to the output of a latch. It is especially important that control signals not be erroneous, or else the instruction sequence may be altered. As a result, a large quantity of data may be corrupted by the erroneous signals. Therefore, still improved means for reducing the probability of a metastable latch output are desirable.

SUMMARY OF THE INVENTION

I have invented an improved latch circuit. Means are included to conduct a desired voltage to a receiving node when the voltage on one or more internal nodes is in an intermediate state between high and low logic levels. Typically, the desired voltage is the output voltage of the latch. In this manner, metastable states may be avoided or reduced.

DETAILED DESCRIPTION

Figure 1:
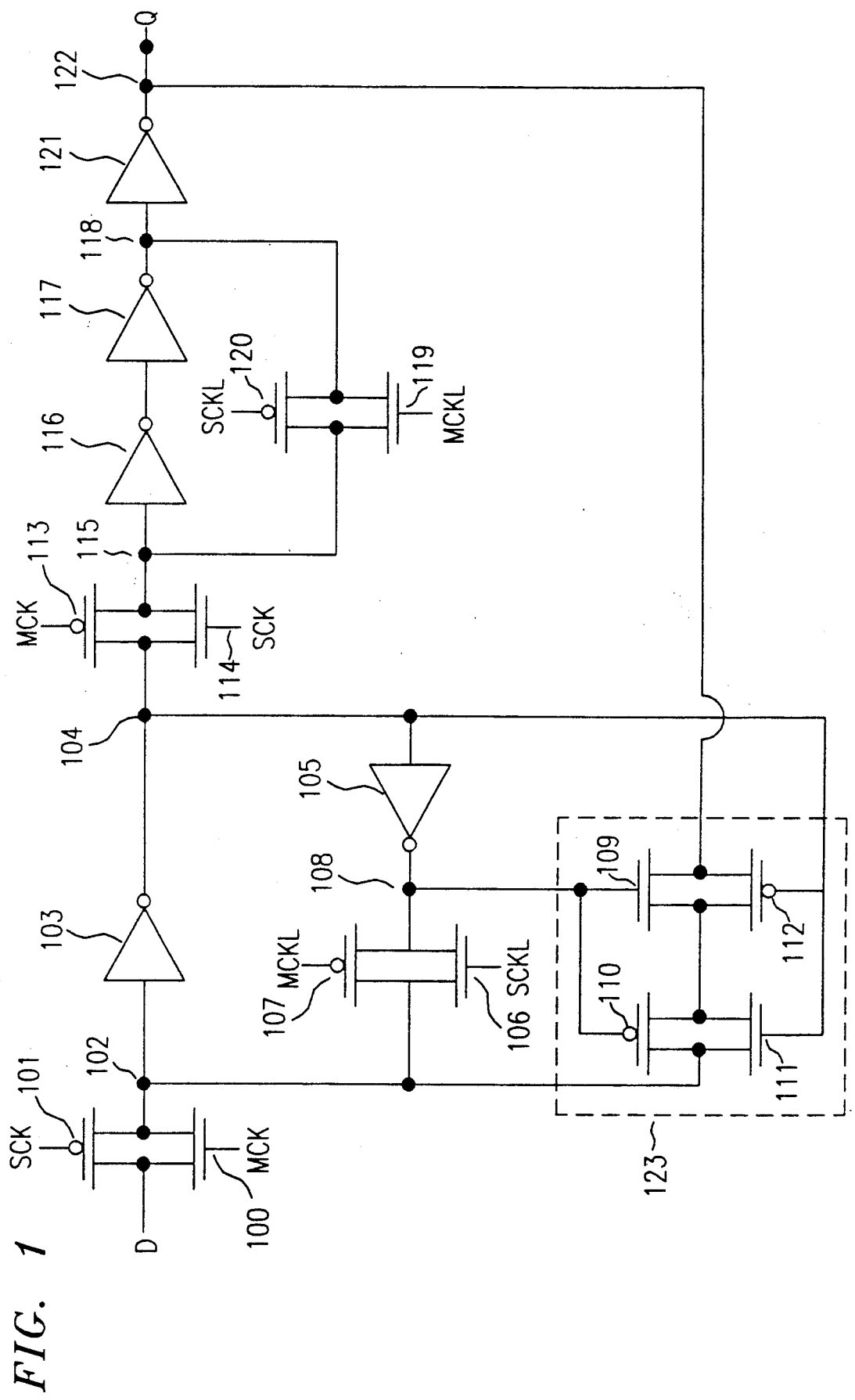
FIG. 1 shows an illustrative embodiment of the invention.

The following detailed description relates to an improved latch circuit technique for reducing or eliminating the occurrence of metastable states. Referring to FIG. 1, an illustrative embodiment of the invention, as implemented in CMOS technology, is shown. However, application to other types of circuit technologies, including bipolar types, is possible, and included herein. The "D" input signal to the latch is applied to the drains of transistors 100 and 101, which form a transmission gate controlled by clocks MCK and SCK, respectively. When MCK goes high (and SCK goes low), the signal is passed to receiving node 102, and inverted by inverter 103 at node 104. From node 104, the signal is again inverted by inverter 105 at node 108. When clock SCKL goes high (MCKL goes low), the signal is passed through transmission gates 106 and 107 back to node 102, thereby providing positive feedback to inverter 103 that latches node 104 in a stable state in normal operation.

On the next master clock transition, MCK goes low (SCK goes high), and the signal at node 104 is passed through transmission gates 113 and 114 to node 115. From node 115, the signal is inverted by inverters 116 and 117, and inverted again by inverter 121, where it appears at the "Q" output (node 122). The next time that the delayed clock signal MCKL goes high (SCKL goes low), the feedback signal is passed from node 118 back to node 115 through transmission gates 119 and 120. Therefore, inverters 116 and 117 are latched in a stable state in normal operation, so that the Q output signal is also latched in a stable state through inverter 121. The operation as thus described as "normal" means that the D input signal did not make a transition simultaneously with the high-to-low transition of clock signal MCK (or low-to-high transition of clock SCK). Hence, no metastable condition is created.

Referring to the "intermediate state transmission means" 123, it will be seen that n-channel transistor 109 is serially connected to p-channel transistor 110, with their gates being tied together and connected to node 108. Similarly, n-channel transistor 111 is serially connected to p-channel transistor 112, and their gates are tied together and connected to node 104. In normal operation, node 108 is at a stable state (either high or low), so that one of the transistors 109 and 110 is turned off (non-conducting). Similarly, in normal operation, node 104 is in a stable state, opposite to the state of node 108, so that one of transistors 111 and 112 is turned off. Therefore, the voltage on the output node 122 is not coupled to node 102 through the intermediate state transmission means 123, and the operation of the latch circuitry proceeds as described above.

However, consider the situation in which node 102 is in an intermediate state between $V_{DD}$ and $V_{SS}$ when clock MCK goes low. For example, node 102 may be metastable at around the threshold of inverter 103 if there is contention between the D input signal and the feedback signal from inverter 105. In that case, an intermediate voltage between $V_{DD}$ and $V_{SS}$ will be produced on node 104 by the action of inverter 103. The intermediate voltage on node 104 will cause conduction to occur through transistors 111 and 112, effectively connecting the Q output (node 122) to the node 102, thereby forcing node 102 to assume the logic level of the Q output (since the low MCK isolates node 102 from the D input signal). A similar situation arises if node 108 assumes an intermediate voltage level due to the action of inverter 105. In that case, the intermediate voltage on node 108 causes transistors 109 and 110 to conduct, which similarly provides a conducting path from the Q output to the node 102, thereby forcing node 102 to assume the logic level of the Q output. Note that in a typical case of indeterminate voltages levels, conduction occurs through both transistor pairs 109–110 and 111–112, although conduction through only one of the pairs is sufficient to prevent a metastable output condition.

Figure 2:
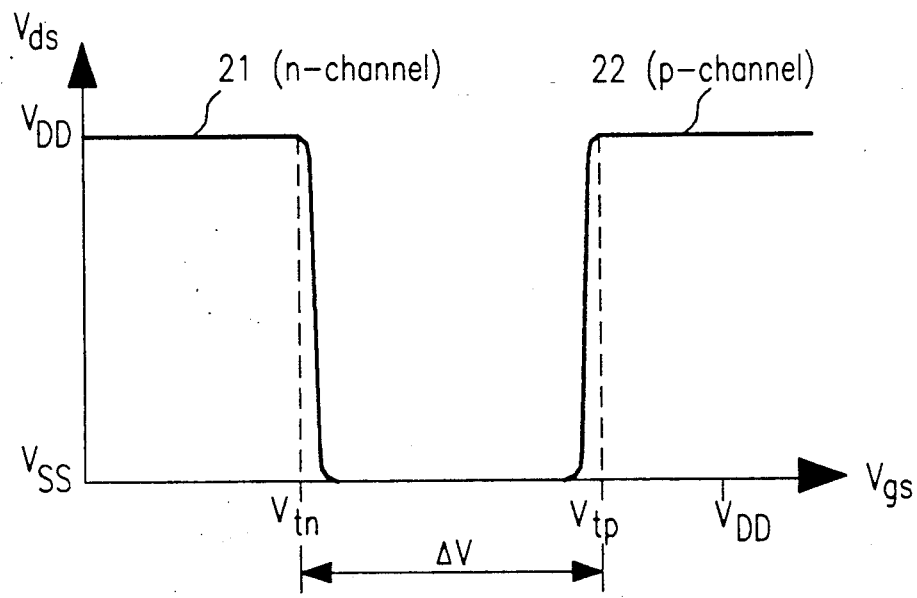
FIG. 2 shows the voltage across typical n-channel and p-channel devices as a function of gate voltage.
Figure 3:
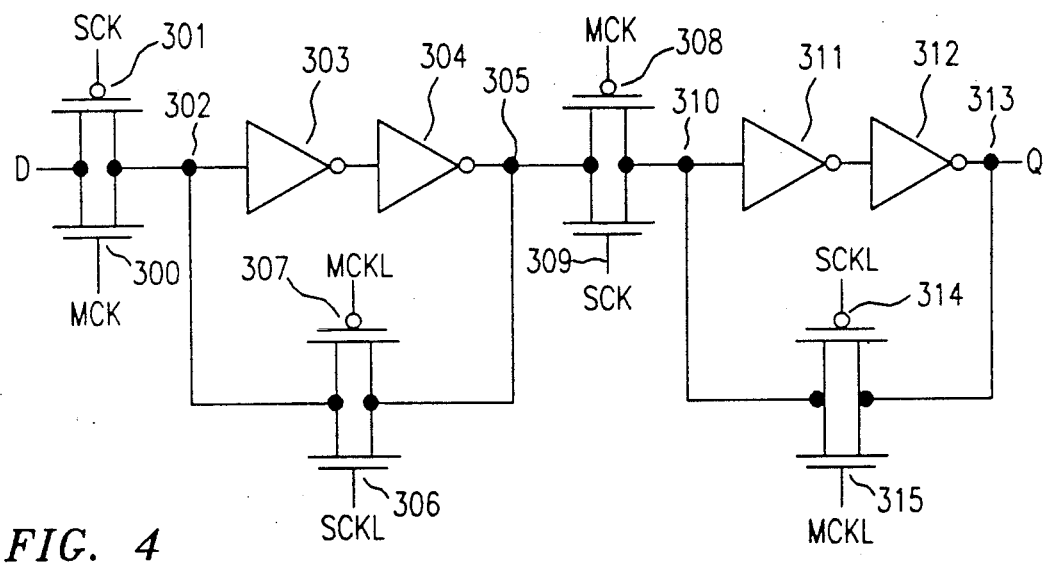
FIG. 3 shows a typical prior art DQ latch circuit.
Figure 4:
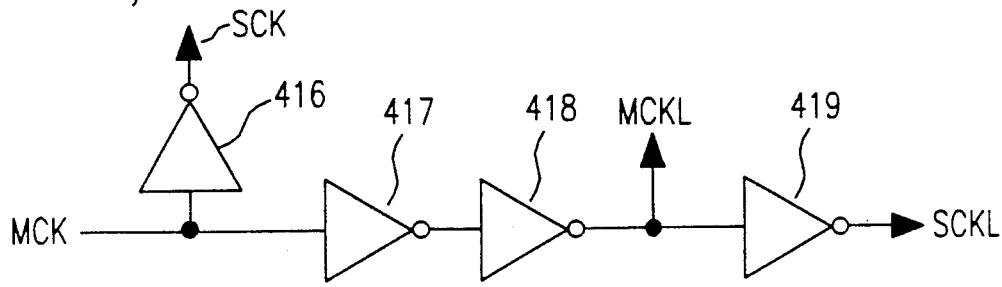
FIG. 4 shows a typical prior art clock generation circuit.

It will be understood by persons of skill in the art that a series connection between n-channel and p-channel transistors having their gates connected together is typically considered to be a non-conducting path, since one of the transistors is usually assumed to be turned off. In fact, that is the principle by which complementary CMOS inverters provide for low power supply consumption. However, referring to FIG. 2, the known characteristic curves of typical n-channel and p-channel transistors (21 and 22, respectively) are shown on the same graph, for the case wherein the channel currents are small. Since the gates and sources of transistors 109 and 110 (and 111 and 112) are tied together, the gate-to-source voltage $V_{gs}$ is the same for both the n-channel and p-channel transistor. It can be seen that as $V_{gs}$ exceeds the threshold of the n-channel transistor ($V_{tn}$), the drain-to-source voltage $V_{ds}$ goes rapidly to zero due to conduction through the channel. Similarly, when $V_{gs}$ is below the threshold of the p-channel transistor ($V_{tp}$), the drain-to-source voltage rapidly drops to zero due to conduction through the channel. Therefore, a conducting path exists through the series pair of n and p channel transistors when the gate voltage is in the range between $V_{SS}+V_{tn}$ and $V_{DD}-V_{tp}$. Furthermore, the action of the series pair of n-channel and p-channel devices ensures that no conduction will occur through the pair when the gate voltage is outside this range (e.g., at $V_{SS}$ or $V_{DD}$), as is the case when the nodes connected to the gates are in a stable state.

It can be seen that two complementary pairs (109–110 and 111–112) are shown in a parallel configuration, which provides for minimal voltage drop when the pairs are turned on. However, in some cases only a single pair is sufficient to provide protection against metastable states. On the other hand, additional complementary pairs may be provided for other feedback paths, depending on the number of nodes that might hang in an intermediate state. Furthermore, the above embodiment has shown that the conduction path through the intermediate state transmission means (123) is from the Q output node to receiving node 102 at the input of the first inverter (103). That configuration forces the latch to remain in the last stable state in the case of a conflict at the receiving node. However, other conduction paths are possible. For example, the intermediate state transmission means may be connected to a fixed logic level (e.g., $V_{DD}$ or $V_{SS}$), so that the node 102 is forced to that known level at the onset of an intermediate state at one of the internal nodes (e.g., 104 or 108). Note that although node 102 is designated as an "receiving" node herein, other nodes may be found that can force the output to assume the desired state, and hence may be controlled by the intermediate state transmission means.

Figure 5:
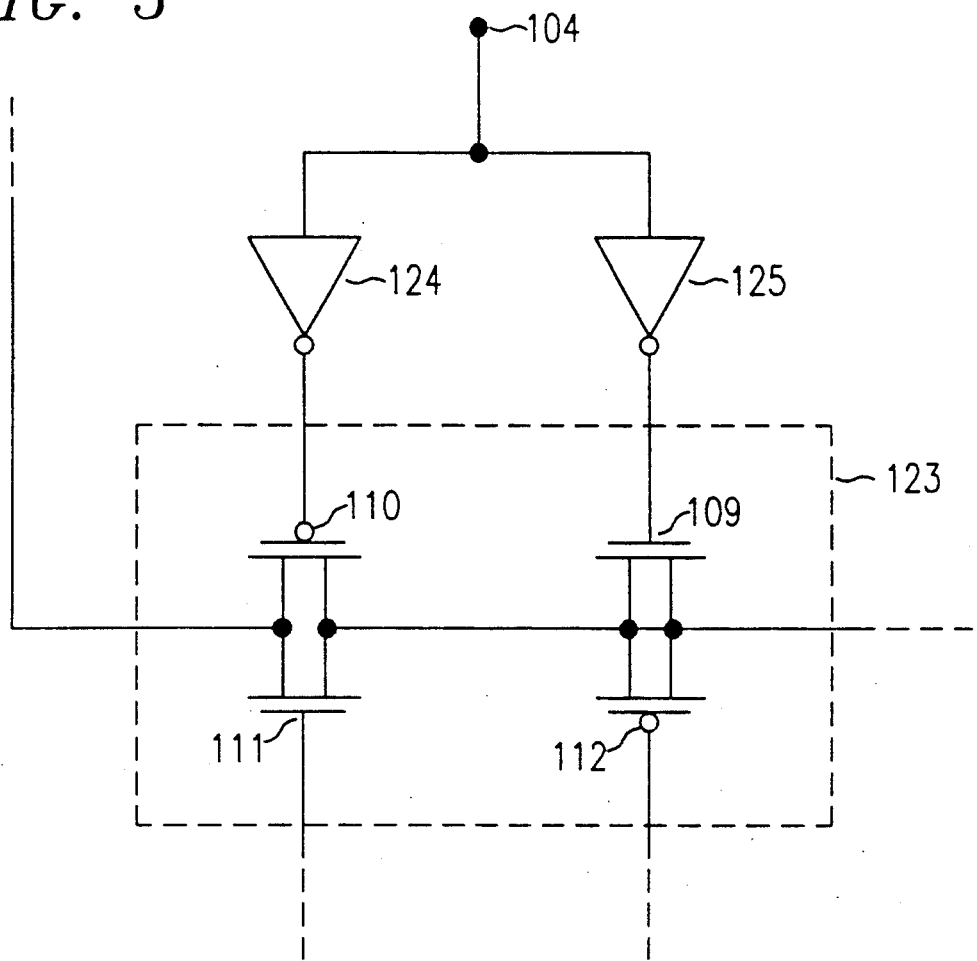
FIG. 5 shows an alternate embodiment of the intermediate state transmission means.
Figure 6:
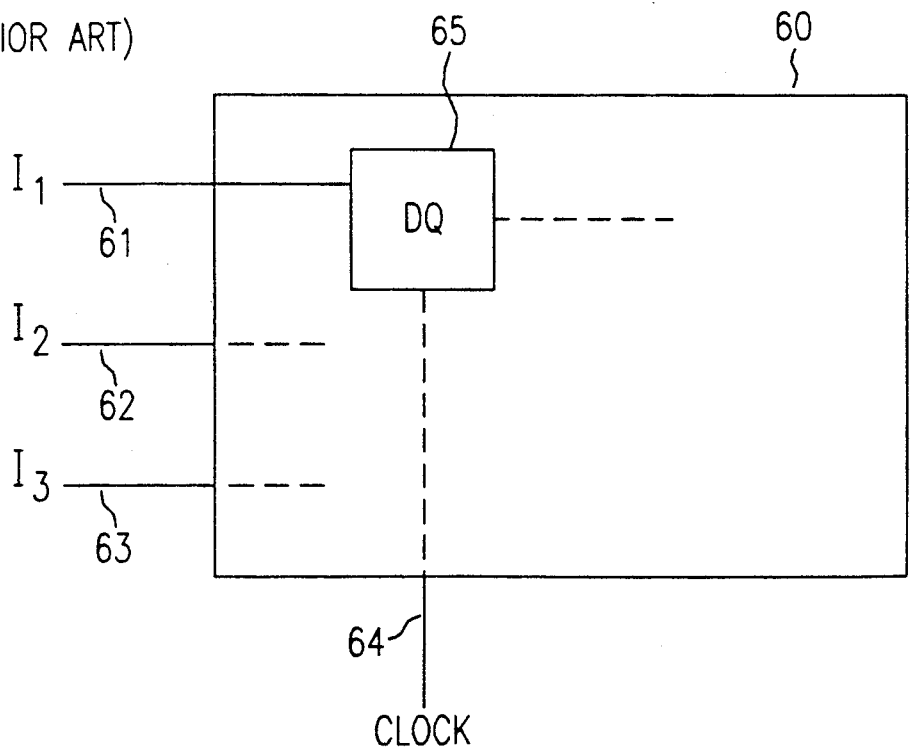
FIG. 6 shows a system having a processor and an input latch that receives asynchronous inputs.

The gates of each transistor in a given series pair (109–110 and 111–112) are shown connected together, and driven from complementary nodes (108 and 104, respectively) in the above embodiment. However, the gates may be separately driven. For example, as shown in FIG. 5, a first inverter (125) may drive the n-channel transistor in a given pair (e.g., transistor 109), whereas a second inverter (124) may drive the p-channel transistor in the pair (e.g., transistor 110). The switching thresholds of the first and second inverters may then be chosen to be different, so as to increase the time period in which both transistors in the series pair conduct. In this manner, a more robust signal may be provided to the receiving node (102), even with only a single series pair. Also, one or more control transistors may be included with intermediate state transmission means 123, to allow conduction only in certain cases. For example, conduction only when the output node 122 is low (or alternatively only when node 122 is high) may be desirable in some designs. Finally, while the above embodiment has been given in terms of a DQ latch, the application of the present invention to various other types of latch circuits is clearly possible, and included herein.

I claim:

1. An integrated circuit comprising: a latch circuit having a receiving node and at least one internal node that is stable in either of two voltage levels;

characterized in that said integrated circuit further comprises intermediate state transmission means comprising an n-channel transistor connected in series with a p-channel transistor that transmits a voltage level to said receiving node only when the voltage on said internal node is at an intermediate level between said two voltage levels, whereby said internal node attains stability in one of said two voltage levels.

2. The integrated circuit of claim 1 wherein the gate of said n-channel transistor and the gate of said p-channel transistor are connected together, and to said internal node.

3. The integrated circuit of claim 1 wherein the gate of said n-channel transistor is driven by a first inverter, and the gate of said p-channel transistor is driven by a second inverter.

4. The integrated circuit of claim 3 wherein the switching threshold of said first inverter is chosen to be different than the switching threshold of said second inverter.

5. The integrated circuit of claim 1 wherein said receiving node is coupled to receive an input signal through a transmission gate means that is controlled by a clock signal, whereby said input signal is conducted to said receiving node during a first clock phase, and said receiving node is isolated from said input signal during a subsequent clock phase.

6. An integrated circuit including a latch circuit comprising:

a first transmission gate (100, 101) coupled to receive a latch input signal (D);
   a first inverter (103) having an input connected to said first transmission gate at a receiving node (102), and having an output connected to a first internal node (104);
   a second inverter (105) having an input connected to said first internal node (104) and having an output connected to a second internal node (108);
   a second transmission gate (106, 107) connected between said second internal node (108) and said receiving node (102); and
   an output node (122) that assumes either of two stable voltage levels;
   characterized in that said integrated circuit further comprises intermediate state transmission means (109-110; 111-112) that transmits a desired stable voltage level to said receiving node (102) when either or both of the first and second internal nodes is at an intermediate voltage level between said two stable voltage levels, thereby causing said output node (122) to assume one of said two voltage levels.

7. The integrated circuit of claim 6 further comprising:

a third transmission gate (113, 114) connected between said first internal node (104) and the input of a third inverter (116);
   a fourth inverter (117) having an input connected to the output of said third inverter (116), and having an output connected to the input of a fifth inverter (121); with the output of said fifth inverter being connected to said output node (122); and
   a fourth transmission gate (119, 120) connected between the output of said fourth inverter (117) and the input of said third inverter (116).

8. The integrated circuit of claim 1 wherein said latch circuit has an output node, and said voltage level that is transmitted to said receiving node is derived from said output node.

9. A system comprising a processor, a clock for controlling said processor, and an input from a source that is asynchronous to said clock;

wherein said processor further comprises: a latch circuit having a receiving node coupled to said input and at least one internal node that is stable in either of two voltage levels;
   characterized in that said processor further comprises intermediate state transmission means comprising an n-channel transistor connected in series with a p-channel transistor that transmits a voltage level to said receiving node only when the voltage on said internal node is at an intermediate level between said two voltage levels, whereby said internal node attains stability in one of said two voltage levels.

10. The system of claim 9 wherein said input receives a control signal the controls the sequence of instructions applied to said processor.

11. The system of claim 9 wherein the gate of said n-channel transistor and the gate of said p-channel transistor are connected together, and to said internal node.

12. The system of claim 9 wherein the gate of said n-channel transistor is driven by a first inverter, and the gate of said p-channel transistor is driven by a second inverter.

13. The system of claim 9 wherein the switching threshold of said first inverter is chosen to be different than the switching threshold of said second inverter.

14. The system of claim 9 wherein said receiving node is coupled to receive said input through a transmission gate means that is controlled by a clock signal, whereby said input is connected to said receiving node during a first clock phase, and said receiving node is isolated from said input during a subsequent clock phase.

15. The system of claim 9 wherever said latch circuit has an output node, and said voltage level that is transmitted to said receiving node is derived from said output node.

* * * * *